(12) United States Patent
Chiba et al.

(10) Patent No.: US 7,027,227 B2
(45) Date of Patent: Apr. 11, 2006

(54) THREE-DIMENSIONAL STRUCTURE FORMING METHOD

(75) Inventors: Keiko Chiba, Tochigi (JP); Kenichiro Mori, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/761,293

(22) Filed: Jan. 22, 2004

(65) Prior Publication Data

US 2004/0152021 A1    Aug. 5, 2004

(30) Foreign Application Priority Data

Jan. 22, 2003    (JP) .............................. 2003-014050

(51) Int. Cl.
    *G02B 27/10*    (2006.01)
(52) U.S. Cl. ........................ 359/619; 359/620; 430/312
(58) Field of Classification Search ................ 359/619, 359/620; 430/312
    See application file for complete search history.

(56) References Cited

U.S. PATENT DOCUMENTS 6,861,205 B1 *    3/2005    Bowman et al. ............ 430/312

2002/0024741 A1    2/2002    Terasawa et al. ........... 359/627

FOREIGN PATENT DOCUMENTS

| EP | 1045288 A2 * | 10/2000 |
|----|--------------|---------|
| JP | 62-115718    | 5/1987  |
| JP | 63-289817    | 11/1988 |
| JP | 64-64220     | 3/1989  |
| JP | 5-68846      | 9/1993  |
| JP | 2001-228401  | 8/2001  |
| JP | 2002-287370  | 10/2002 |

* cited by examiner

*Primary Examiner*—Huy Mai
(74) *Attorney, Agent, or Firm*—Fitzpatrick, Cella, Harper & Scinto

(57) ABSTRACT

A method for forming a three-dimensional structure made of a photosensitive material on a substrate includes the steps of determining a film thickness of the photosensitive material necessary to form the desired three-dimensional structure, comparing a predetermined maximum film thickness with the film thickness determined by the determining step, and applying, when the film thickness determined by the determining step is greater than the predetermined maximum film thickness, the photosensitive material within the maximum film thickness plural times until the photosensitive material has the film thickness on the substrate.

16 Claims, 15 Drawing Sheets

THREE-DIMENSIONAL STRUCTURE FORMING METHOD

This application claims a benefit of priority based on Japanese Patent Application No. 2003-014050, filed on Jan. 22, 2003, which is hereby incorporated by reference herein in its entirety as if fully set forth herein.

BACKGROUND OF THE INVENTION

The present invention relates, generally, to a three-dimensional structure forming method, and more particularly, to a method for forming a three-dimensional structure on a thick, photosensitive resin.

Recent demand for smaller and lower-profile electronic devices has increasingly required finer semiconductor devices to be mounted onto these electronic devices, and a critical dimension has become smaller than 0.15 μm. For this requirement, various proposals have been made to improve resolving power of a projection exposure apparatus.

The resolution improves effectively with increased numerical aperture ("NA") of the projection optical system or higher NA and a shortened wavelength of an exposure light source. Therefore, exposure light sources have recently been in transition from the KrF excimer laser (with a wavelength of approximately 248 nm) to the ArF excimer laser (with a wavelength of approximately 193 nm), and the $F_2$ excimer laser (with a wavelength of approximately 157 nm), which have been almost reduced to practice.

The projection optical system is subject to chromatic aberration that deteriorates imaging performance because a glass material has different indexes of refraction according to light wavelengths. Therefore, a projection exposure apparatus that uses the KrF excimer laser as an exposure light source narrows its band to emit a single beam. A projection exposure apparatus that uses the ArF excimer laser as an exposure light source employs, for achromatism, two types of glass materials, such as quartz ($SiO_2$) and calcium fluoride ($CaF_2$), for an optical system.

However, the $F_2$ laser for use with an exposure light source limits the light transmitting glass material. Currently, $CaF_2$, magnesium fluoride ($MgF_2$), lithium fluoride (LiF), etc. are those glass materials, which provide the desired transmittance. However, only $CaF_2$ is a viable glass material, which provides an optical system in the projection optical system with the necessary uniformity and a large aperture of the crystal. Therefore, the achromatism is not available through two kinds of glass materials, unlike the projection exposure apparatus that uses the ArF excimer laser as an exposure light source.

Accordingly, there has been proposed a projection optical system that uses for achromatism a catadioptric system including a mirror as well as lenses (see, for example, Japanese Laid-Open Patent Application No. 2001-228401). Such a projection optical system requires the mirror not to shield the light, and thus typically utilizes an arc imaging area having a certain height from the optical axis.

A projection optical system that projects a pattern on a mask (or a reticle) onto a substrate that applies a photosensitive agent, through a projection optical system that forms an arc imaging area, needs an illumination apparatus for illuminating a mask with an arc illumination area. Typically, a rectangular slit 1000 shown in FIG. 14 is illuminated, and an arc opening 1100 and a light shielding part 1200 take out an arc illumination area. Here, FIG. 14 is a schematic plane view showing one example of the slit 1000 for taking the arc illumination area out of the rectangular illumination area.

However, in taking the arc illumination area out of the rectangular illumination area, the slit shields light and lowers illumination efficiency, and cannot obtain high light intensity on the photosensitive substrate. As the light intensity on the photosensitive substrate decreases, the exposure time increases and the circuit-pattern transfer per unit time, or throughput, decreases. Therefore, the high light intensity is necessary on the photosensitive substrate.

For enhanced light intensity on the photosensitive substrate, there have been provided a method that uses an optical fiber (see, for example, Japanese Laid-Open Patent Publication No. 5-68846), and a method that uses an arc fly-eye lens that has an arc outline of an element lens (see, for example, Japanese Laid-Open Patent Publication No. 62-115718). However, a method that uses an optical fiber has a practical difficulty because it cannot make the light sufficiently uniform through the optical fiber, and no optical fiber can handle a wavelength of 157 nm.

On the other hand, it is tremendously arduous to manufacture the arc fly-eye lens by processing rod lenses and cutting each outline into an arc shape. In addition, the manufacture tends to produce a large process error. As a consequence, the arc fly-eye lens becomes expensive, and the method that uses the arc fly-eye lens also has a practical difficulty, because it accumulates process errors when piling up respective element lenses, and deteriorates the performance of the entire lens. Accordingly, there has recently been proposed a method for processing a micro lens array using photolithography. In particular, a method for making the arc fly-eye lens with the micro lens array has attracted attention.

Photolithography can be used to relatively inexpensively form an arc fly-eye lens from a micro lens array, with a reduced processing error. This is because it results only from an alignment error of an exposure apparatus, and the error does not accumulate, because the element lens are not piled up. Therefore, this lens hardly deteriorates the entire performance.

According to the photolithographic technique, a two-dimensional circuit pattern formed by a combination of opening and light-shielding parts is transferred onto a photosensitive resin or photoresist etc., and it does not usually depend on a height direction of the circuit pattern or a three-dimensional shape. There has been provided a method that controls the shape in the height direction by partial exposure-amount adjustments and forms a three-dimensional shape on the photoresist (see, for example, Japanese Laid-Open Patent Application No. 63-289817). Moreover, there has been proposed a method that can be used to etch an optical element with a three-dimensional photoresist and manufacture a three-dimensional optical element (see, for example, Japanese Laid-Open Patent Application No. 2002-287370).

The micromechanics, such as a biochip, and an optical element, such as a micro lens array, have recently been required to have a special surface shape. Even in this case, a surface shape of a three-dimensional structure is formed by exposing a photoresist formed on a substrate, with a mask having a two-dimensional transmittance distribution, and then developing the photoresist.

When lithography is used to form a three-dimensional structure on the photoresist as a photosensitive resin, a thickness of the photosensitive resin determines the height of the three-dimensional structure. The photosensitive resin, thickness and selectivity with the substrate in etching define a transfer of a photoresist's shape onto the substrate through anisotropic etching, etc. The three-dimensional structure's height needs to range from sub-micron to about several hundred microns depending on purposes of use, such as a micro lens array.

Instant applicants have discovered that in forming a photosensitive resin with a three-dimensional structure through exposure with a distributed exposure energy amount, a structure shown in FIG. 15 appears on and remarkably roughens the surface, because almost all the parts of the photosensitive resin are developed during the formation of the three-dimensional structure. In other words, after the photosensitive resin is applied on the substrate, baking is performed to remove the solvent, and baking generates the Bernard convection. The Bernard convection produces Bernard cells in the photosensitive resin, and the Bernard cells appear on the surface due to development. Here, the Bernard convection is a thermal convection that induces a pattern called Bernard cells, as a static and horizontal fluid layer is uniformly heated from the bottom, and a difference in temperature between the upper and bottom surfaces reaches a certain extent. Here, FIG. 15 is a schematic plane view showing exemplary Bernard cells generated in the photosensitive resin.

In a method that is used to transfer a three-dimensional structure onto a substrate using etching, it is conceivable to increase the etching selectivity between the photosensitive resin and the substrate, and to form a desired three-dimensional structure even in a photosensitive resin having a small film thickness. However, this method would result in a rougher photosensitive resin shape and newly roughens the shape of the surface.

BRIEF SUMMARY OF THE INVENTION

Accordingly, it is an exemplary object of the present invention to provide a three-dimensional structure forming method that can be used to form a three-dimensional structure on thick photosensitive resin without roughening the shape of the surface.

A three-dimensional structure forming method according to one aspect of the present invention, in which a three-dimensional structure made of a photosensitive material is formed on a substrate, includes the steps of determining a film thickness of the photosensitive material necessary to form the desired three-dimensional structure, comparing a predetermined maximum film thickness with the film thickness determined by the determining step, and applying, when the film thickness determined by the determining step is greater than the predetermined maximum film thickness, the photosensitive material within the maximum film thickness plural times until the photosensitive material has the film thickness on the substrate.

A three-dimensional structure forming method according to another aspect of the present invention includes the steps of applying onto the substrate photosensitive material with a first film thickness within a preset maximum film thickness, and applying onto the photosensitive material with the first film thickness applied onto the substrate the photosensitive material with a second film thickness within the maximum film thickness.

A method for forming a three-dimensional structure made of a photosensitive material on a substrate includes the steps of repetitively applying and baking a photosensitive material, and forming the photosensitive material with a predetermined thickness on the substrate through overlapping applications.

The above method may further include the steps of exposing, with light having an energy distribution corresponding to the desired three-dimensional structure, the photosensitive material applied by the applying step, and developing the photosensitive material that has been exposed. The method may further include the step of etching the substrate using the photosensitive material that has been exposed.

The substrate is, for example, an optical element or a mold. The photosensitive material is made, for example, of novolac resin. The applying step may apply the photosensitive material through a solvent, and the solvent may be propylene glycol monomethyl ether acetate. The maximum film thickness may be equal to or smaller than 12 µm.

The film thickness of the photosensitive material necessary to form the desired three-dimensional structure may be equal to or greater than 12 µm.

An optical element, a biochip, an optical system that includes the optical element, or an exposure apparatus that includes the optical system, manufactured by the above three-dimensional structure forming method, also constitutes another aspect of the present invention. The optical element may be a lens array that forms plural lenses on an array, and the plural lenses may have a shape of a hexagon, an arc, or a rectangle. The shape may have a width between 12 µm and 2 mm.

A device fabricating method as still another aspect of the present invention includes the steps of using the above exposure apparatus to expose the above object, and performing a predetermined process for the object projected and exposed as above claims for a device fabricating method for performing operations similar to that of the above exposure apparatus cover devices as intermediate and final products. Such devices include semiconductor chips, for example an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 9:
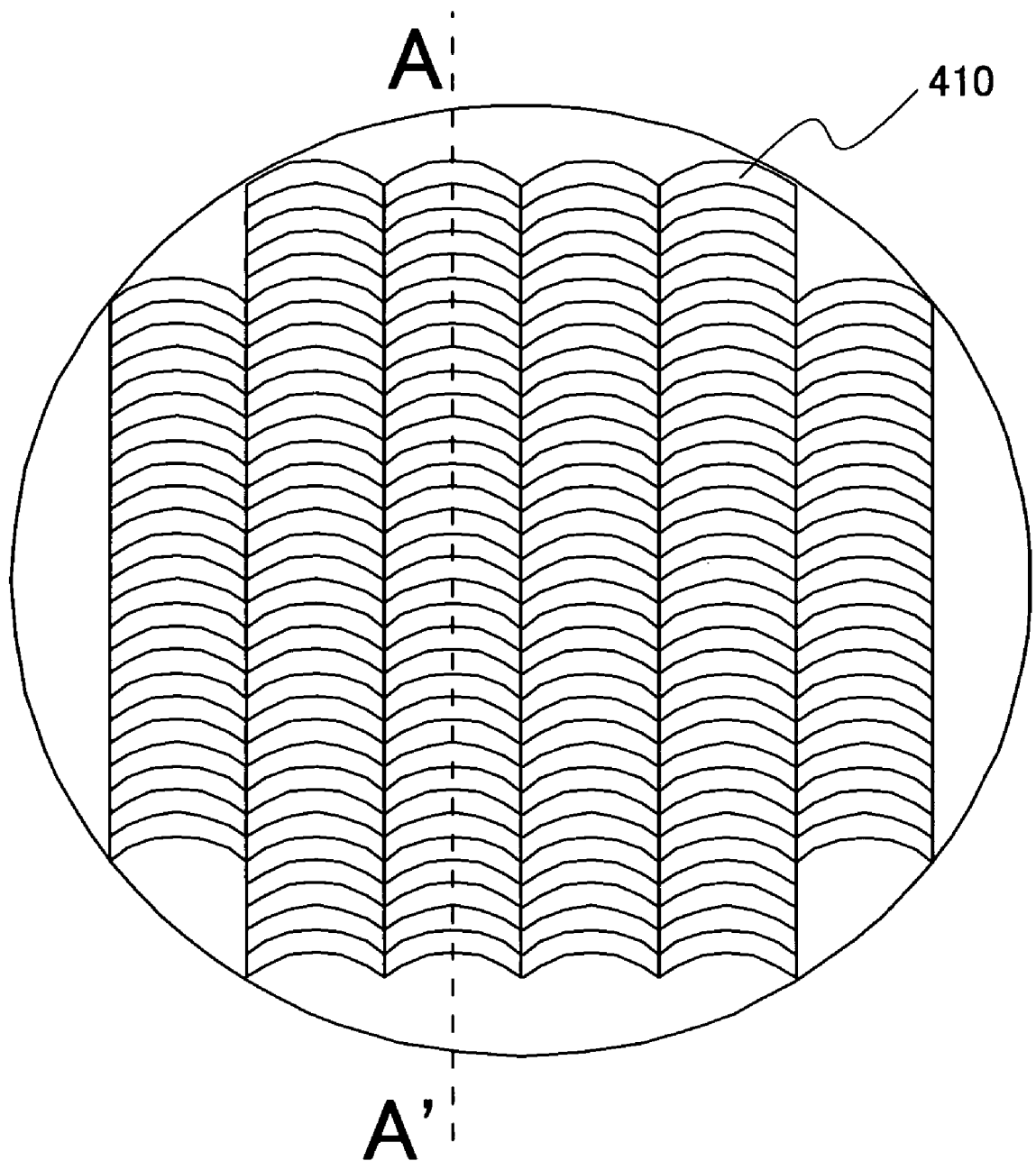
FIG. 9 is a schematic plane view of an arc fly-eye lens.
Figure 10:
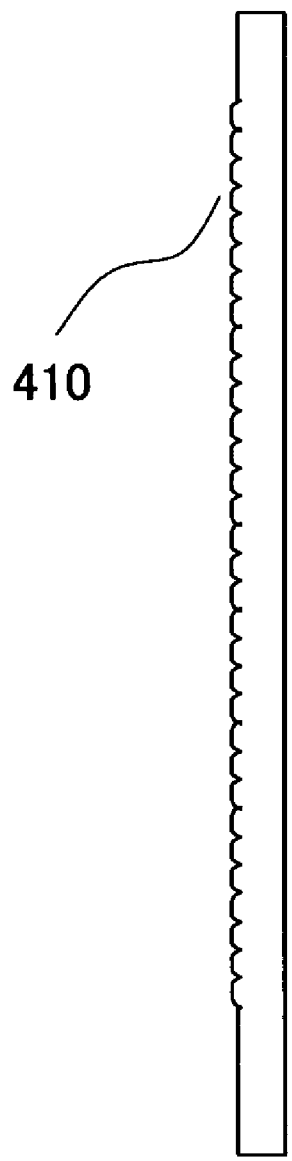
FIG. 10 is a sectional view taken along a line A–A' of the arc fly-eye lens shown in FIG. 9.

First, the instant inventors have reviewed a size of an arc fly-eye lens 400 shown in FIGS. 9 and 10 necessary for a recent projection exposure apparatus that uses, for example, the $F_2$ laser as an exposure light source. Referring to FIGS. 9 and 10, the arc fly-eye lens 400 includes plural element lenses 410 arranged in an array. Here, FIG. 9 is a schematic plane view of the arc fly-eye lens 400, and FIG. 10 is a sectional view taken along line A–A' of the arc fly-eye lens 400 shown in FIG. 9.

In the recent projection exposure apparatus, a wafer has an illumination area of 26×8 mm, and a projection optical system has a NA of about 0.8 to about 0.95. Therefore, the arc fly-eye lens 400 needs an outline $\phi$ of 100 to 160 mm. The excessively small element lens 410 of the arc fly-eye lens 400 would cause interference fringes on the illumination surface and result in a non-uniform exposure amount on the wafer. The excessively large element lens 410 would result in a discrete secondary light source and deteriorate the resolution of a pattern image formed on the wafer.

Therefore, each element lens 410 in the arc fly-eye lens 400 needs to restrict its size, for example, determine a minimum pitch, so that the illumination area includes 10 interference fringes to mitigate a non-uniform exposure amount.

The outline $\Phi$ of the fly-eye lens 400 corresponds to $\sigma=1.0$ in which the NA of the projection optical system is equal to that of the illumination optical system. Equation 1 below defines a pitch p of the interference fringes, where $\lambda$ is a wavelength of light, a is the NA of the projection optical system, and d is a pitch between the element lenses:

$$p = \lambda \times \Phi / (2d \times \alpha) \quad (1)$$

Equation 2 below defines the number of interference fringes Y in the illumination area, where X is a width of the illumination area:

$$Y = X/p = (2 \times d \times X \times \alpha)/(\lambda \times \Phi) \quad (2)$$

Equation 3 below the pitch d of the element lenses, where $\lambda=157$ nm, $\Phi=100$ mm, $\alpha=0.80$, X=8 mm, the number of interference fringes Y is greater than 10:

$$d > 10 \times 0.000157 \times 100/(2 \times 8 \times 0.80) \quad (3)$$

Therefore, the element lenses 410 should maintain the pitch d greater than 12 μm.

A discrete secondary light source that does not deteriorate the imaging performance provides the maximum pitch of the element lens 410. Although the influence of the discrete secondary light source is not strictly quantified, ten or more element lenses 410 in each direction empirically provide good imaging performance. The outline $\Phi$ of 100 mm of the fly-eye lens corresponds to $\sigma=1.0$ in which the NA of the projection optical system is equal to that of the illumination optical system. The illumination condition with $\sigma=0.2$, which is referred to as small a having high coherence, is used in the area of the outline $\Phi$ of 20 mm. Therefore, the element lenses 410 should maintain the pitch equal to or smaller than 2 mm for ten or more element lenses in each direction.

It is thus discovered that the element lenses 410 should maintain the pitch between 12 μm and 2 mm in the arc fly-eye lens 400 used for the recent projection exposure apparatus.

The arc fly-eye lens 400 produced by photolithography requires an optimal thickness of the element lens 410 in view of its pitch and curvature. This requirement necessitates the formation of a thick photosensitive resin on the substrate.

However, the usual photolithography does not depend on a height of the transferred pattern, and the usual photosensitive resin is 1 μm thick or less. In order to form a thick photosensitive resin in one application, it is conceivable to adjust viscosity by changing a ratio with a solvent and the number of revolutions at the coating time. However, this would cause Bernard cells in the photosensitive resin, as discussed above.

In providing a method for forming a three-dimensional structure using thick photosensitive resin without roughening the surface shape, the instant inventors have discovered, as a result of research of a fundamental generation of Bernard cells, that a film thickness of photoresist (photosensitive resin) after baking that is equal to or smaller than 12 μm can reduce a possibility of a generation of the Bernard cells.

Figure 1:
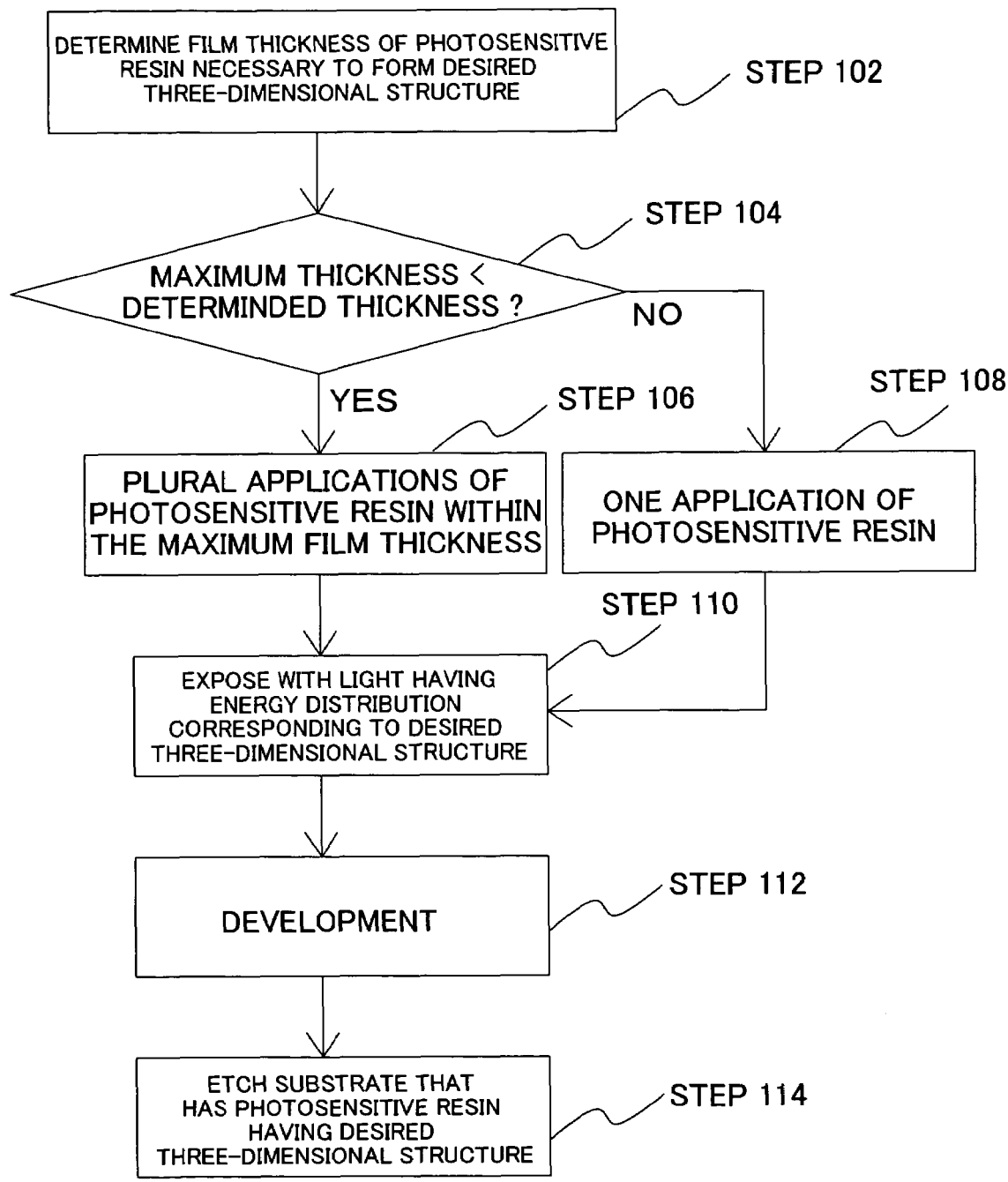
FIG. 1 is a flowchart for explaining a three-dimensional structure method as one aspect according to the present invention.

A three-dimensional structure forming method according to one aspect of the present invention will now be described with reference to the accompanying drawings. FIG. 1 is a flowchart for explaining a three-dimensional structure forming method 100 according to one aspect of the present invention. The inventive three-dimensional structure forming method 100 is a method for forming photosensitive resin with a desired three-dimensional structure on the substrate, and is suitable, for example, for an optical element and a biochip, such as a micro lens array, a hexagonal fly-eye lens, and an arc fly-eye lens.

Referring to FIG. 1, a necessary film thickness of a photosensitive resin is first determined to form a desired three-dimensional structure (Step 102). Next, a determined film thickness and a preset maximum film thickness are compared with each other (Step 104). When the film thickness determined by Step 102 is greater than the set maximum film thickness, the procedure, which includes the steps of applying the photosensitive resin within the maximum film thickness, and baking the resin until the photosensitive resin on the substrate reaches the film thickness determined by the Step 102 (Step 106), is repeated. In other words, the maximum film thickness is set to be a thickness that does not cause Bernard cells (for example, 12 μm or smaller). When the necessary film thickness of the photosensitive resin to form a desired three-dimensional structure is greater than the maximum film thickness, a set of applying and baking steps is repeated several times so as to form a necessary film thickness on the substrate with reduced or eliminated generation of Bernard cells. When the film thickness determined by the Step 102 is smaller than the maximum film thickness, photosensitive resin with the necessary film thickness is applied once on the substrate and is then baked (Step 108).

After the photosensitive resin application(s) with necessary film thickness onto the substrate ends, exposure with light having an energy distribution corresponding to a desired three-dimensional structure (Step 110), follows and the exposed photosensitive resin is developed (Step 112). Thereby, photosensitive resin having a desired three-dimensional structure is formed on the substrate. Although the desired three-dimensional structure may partially develop the photosensitive resin, photosensitive resin with a highly precise three-dimensional structure is formed with few Bernard cells in the photosensitive resin or a hardly roughened surface shape, because the photosensitive resin is applied onto the substrate within the maximum film thickness.

In the above procedure, it is efficient to repeat an application of photosensitive resin with almost the same thickness for plural applications.

The desired three-dimensional structure can be transferred on the substrate by etching the substrate that has the photosensitive resin formed with a desired three-dimensional structure.

The instant inventors have conducted the above three-dimensional structure forming method 100 under different process conditions, such as the desired three-dimensional structure and substrate.

First Embodiment

FIG. 2 is a schematic sectional view showing a substrate in each manufacture process in a first embodiment. A substrate 10 is a UV-viable synthetic quartz substrate, in particular, F-doped quartz or calcium fluoride as an optical element for the $F_2$ laser. Resist 12a as photosensitive resin of AZ-P4620 (Clariant Co. viscosity 400 cSt novolac resin, solvent: propylene glycol monomethyl ether acetate ("PGMEA")) was formed with a film thickness of 10 μm on the substrate 10 with a coater. Resist 12b with a film thickness of 10 μm was formed under the same conditions, and resist 12 with a total film thickness of 20 μm was formed (see FIG. 2A). The resists 12a and 12b did not differ in resist characteristics and could be treated as one layer of resist.

Figure 2A:
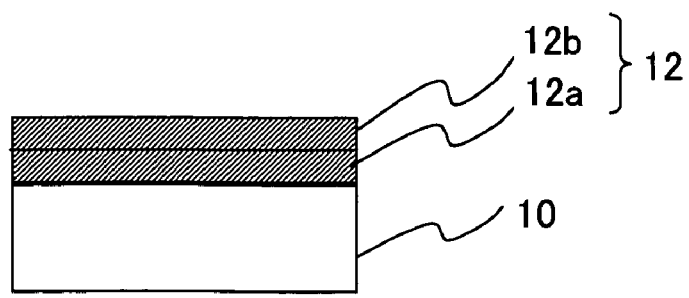
FIG. 2 is a schematic sectional view showing a substrate for each manufacture process of a first embodiment.
Figure 2B:
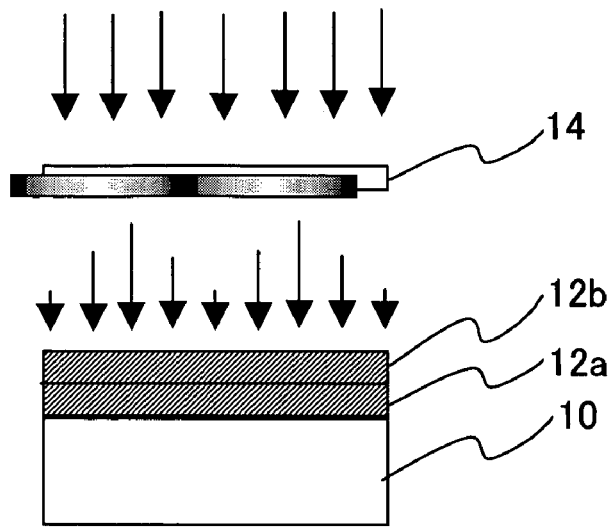
Figure 2C:
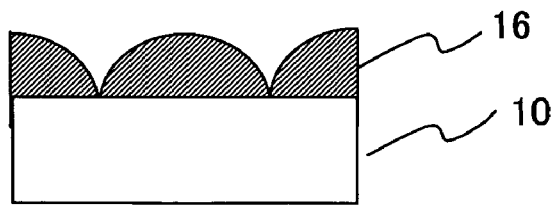

Exposure followed with a mask 14 having a transmittance distribution designed to form the desired three-dimensional structure (see FIG. 2B). No Bernard cells occurred in the photosensitive resin after development with a dedicated developer, and the photosensitive resin 16 with a desired three-dimensional structure was formed on the substrate 10 (see FIG. 2C).

Depending upon a wavelength for use with an optical element, e.g., He—Ne laser with a wavelength of 633 nm, photosensitive resin 16 having the desired three-dimensional structure can be used as it is for the optical element.

Figure 2D:
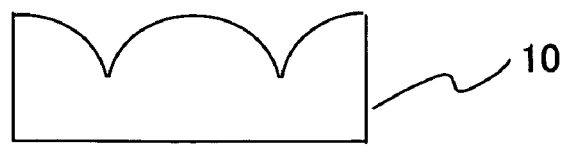

The instant embodiment used a dry etching apparatus to conduct anisotropic etching with a selectivity of 1 and transfer a shape of the photosensitive resin 16 onto the substrate 10 (see FIG. 2D). The desired optical element could be thus manufactured without forming Bernard cells that roughened the surface shape.

COMPARATIVE EXAMPLE

Figure 3A:
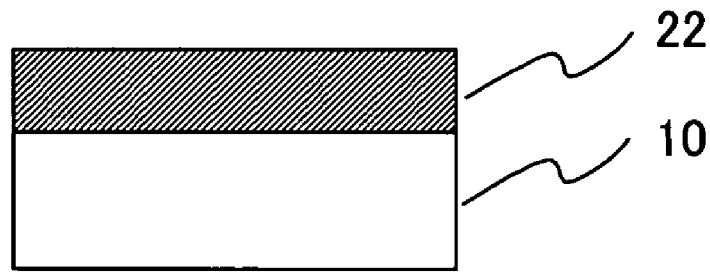
FIG. 3 is a schematic sectional view showing a substrate for each manufacture process of a comparative example.

FIG. 3 is a schematic sectional view showing a substrate in each manufacture process in a comparative example. A coater formed resist 22 as photosensitive resin of AZ-P4903 (Clariant Co. viscosity 1500 cSt novolac resin, solvent: PGMEA) with a film thickness of 20 μm on the substrate 10 similar to that in the first embodiment in one application (see FIG. 3A). The resist 22 had a smooth surface at this time.

Figure 3B:
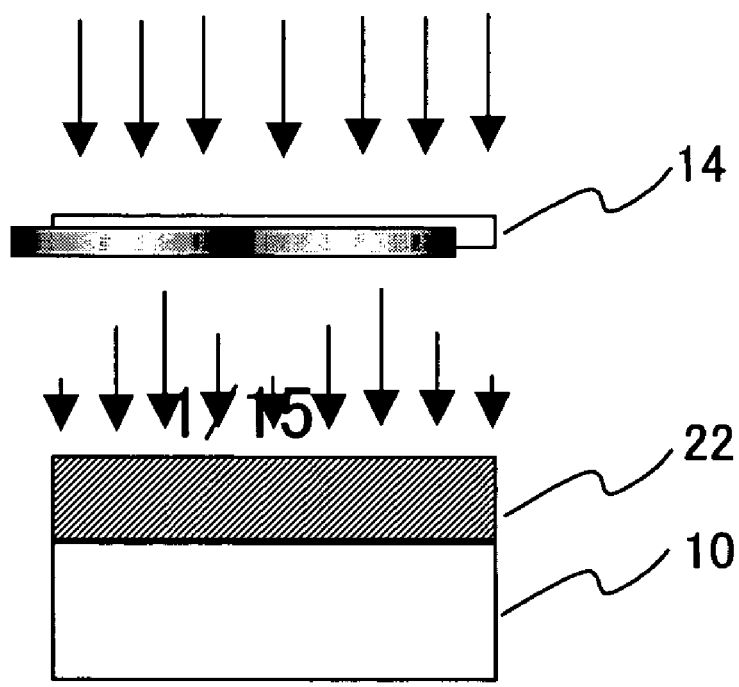

Exposure followed with a mask 14 similar to that in the first embodiment (see FIG. 3B). Then, a development with a dedicated developer followed, and photosensitive resin 24 with a three-dimensional structure was formed. Bernard cells were formed over the surface and roughened the surface shape.

Second Embodiment

FIG. 4 is a schematic sectional view showing a substrate in each manufacture process in a second embodiment. A substrate 30 is a ceramic plate used as a glass mold. The instant embodiment used SiC that could be processed with a gas of fluorine and chlorine systems. Ceramics is a low thermal expansion material with good repetitive heating and cooling resistance and suitable for a glass mold. However, it has disadvantages in hard maintenance of surface flatness and hard processability. A noble metal coating could maintain the surface flatness, but the processability has been a major problem along with the recently required higher accuracy and complicated shape.

Resist 32a as photosensitive resin of PMER P-LA900PM (Tokyo Ohka Kogyo Co., Ltd., viscosity 900 cSt novolac resin, solvent: PGMEA) was formed with a film thickness of 12 μm on a substrate 30 with a coater. Resists 32b and 32c were formed with a film thickness of 12 μm under the same conditions, and resist 32 was formed with a total film thickness of 36 μm (see FIG. 4A). The resists 32a, 32b and 32c did not differ in resist characteristics and could be treated as one layer of resist.

Figure 4A:
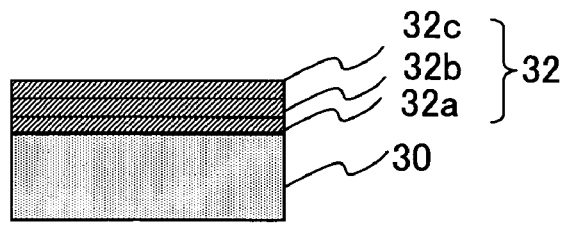
FIG. 4 is a schematic sectional view showing a substrate for each manufacture process of a second embodiment.
Figure 4B:
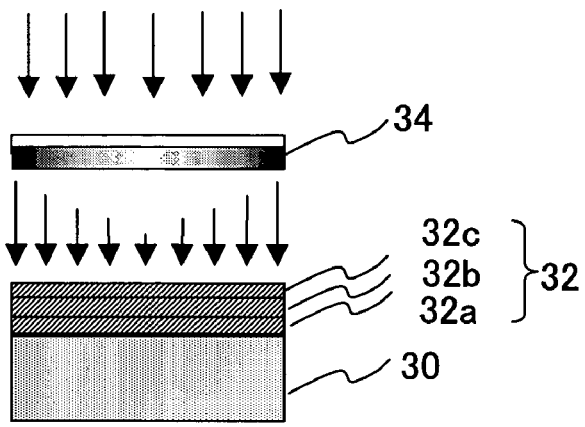
Figure 4C:
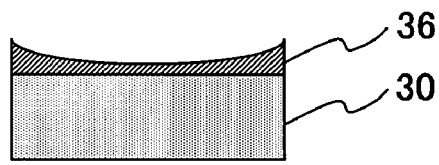

Exposure followed with a mask 34 having a transmittance distribution designed to form the desired three-dimensional structure (see FIG. 4B). No Bernard cells occurred in the photosensitive resin after development with a dedicated developer, and the photosensitive resin 36 having a desired three-dimensional structure was formed on the substrate 30; (see FIG. 4C).

Figure 4D:
Figure 4E:
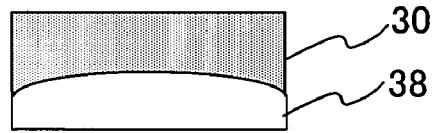
Figure 4F:
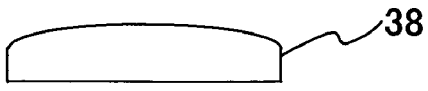

The instant embodiment used a dry etching apparatus to conduct anisotropic etching with a selectivity of 1 and transfer a shape of the photosensitive resin 36 onto the substrate 30 (see FIG. 4D). Pt (not shown) was coated on the substrate 30, and glass 38 was molded, as shown in FIG. 4E, with a glass mold (see FIG. 4F). A desired optical element with high temperature molding resistance, which could easily process a complicated shape, such as an aspheric surface, could be thus manufactured without forming Bernard cells that roughened the surface shape.

Third Embodiment

Figure 5A:
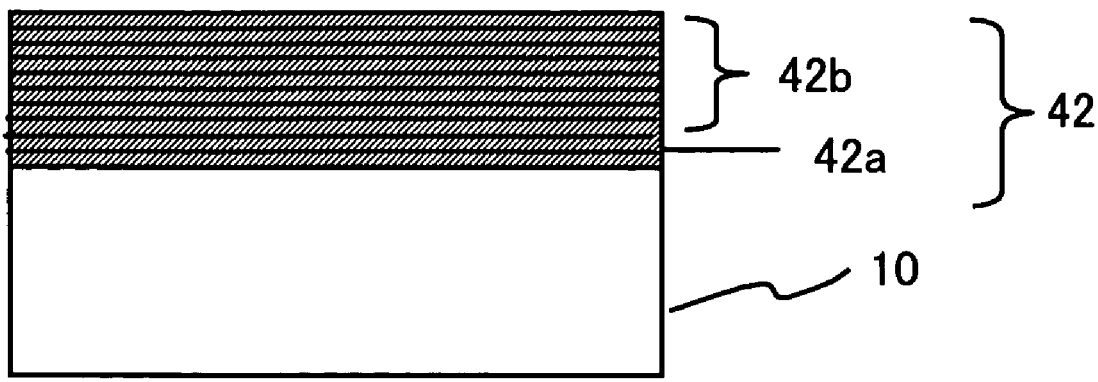
FIG. 5 is a schematic sectional view showing a substrate for each manufacture process of a third embodiment.

FIG. 5 is a schematic sectional view showing a substrate in each manufacture process in a third embodiment. This embodiment forms a hexagonal micro lens array on the substrate 10 similar to that in the first embodiment. Resist 42a as photosensitive resin of AZ-P4620 (Clariant Co. viscosity 400 cSt novolac resin, solvent: PGMEA) was formed with a film thickness of 10 μm on the substrate 10 with a coater. Resist 42b with a film thickness of 10 μm was formed nine times under the same conditions, and resist 42 was formed with a total film thickness of 100 μm (see FIG. 5A). The resists 42a and 42b did not differ in resist characteristics and could be treated as one layer of resist.

Exposure followed with a mask having a transmittance distribution designed to form the hexagonal micro lens array. No Bernard cells occurred in the photosensitive resin after development with a dedicated developer, and the photosensitive resin 46 was formed with a hexagonal micro lens array on the substrate 10 (see FIG. 5B).

Figure 5B:
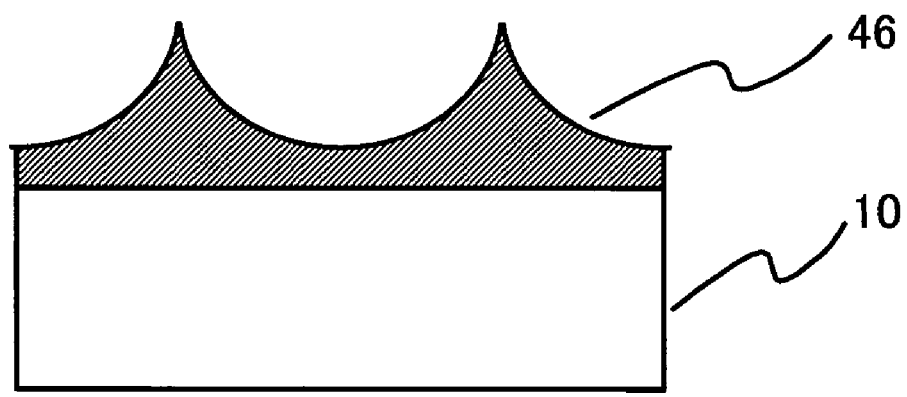
Figure 5C:
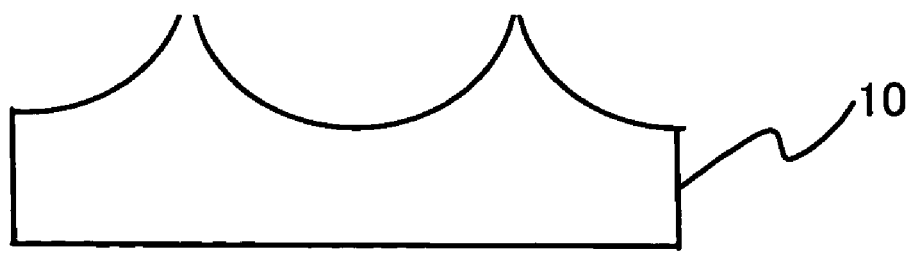

The instant embodiment used a dry etching apparatus to conduct anisotropic etching with a selectivity of 1 and transfer a shape of the photosensitive resin 46 onto the substrate 10 (see FIG. 5C). The desired hexagonal micro lens array could be thus manufactured on the photosensitive resin 42 with a film thickness of 100 μm, as shown in FIG.

Figure 6:
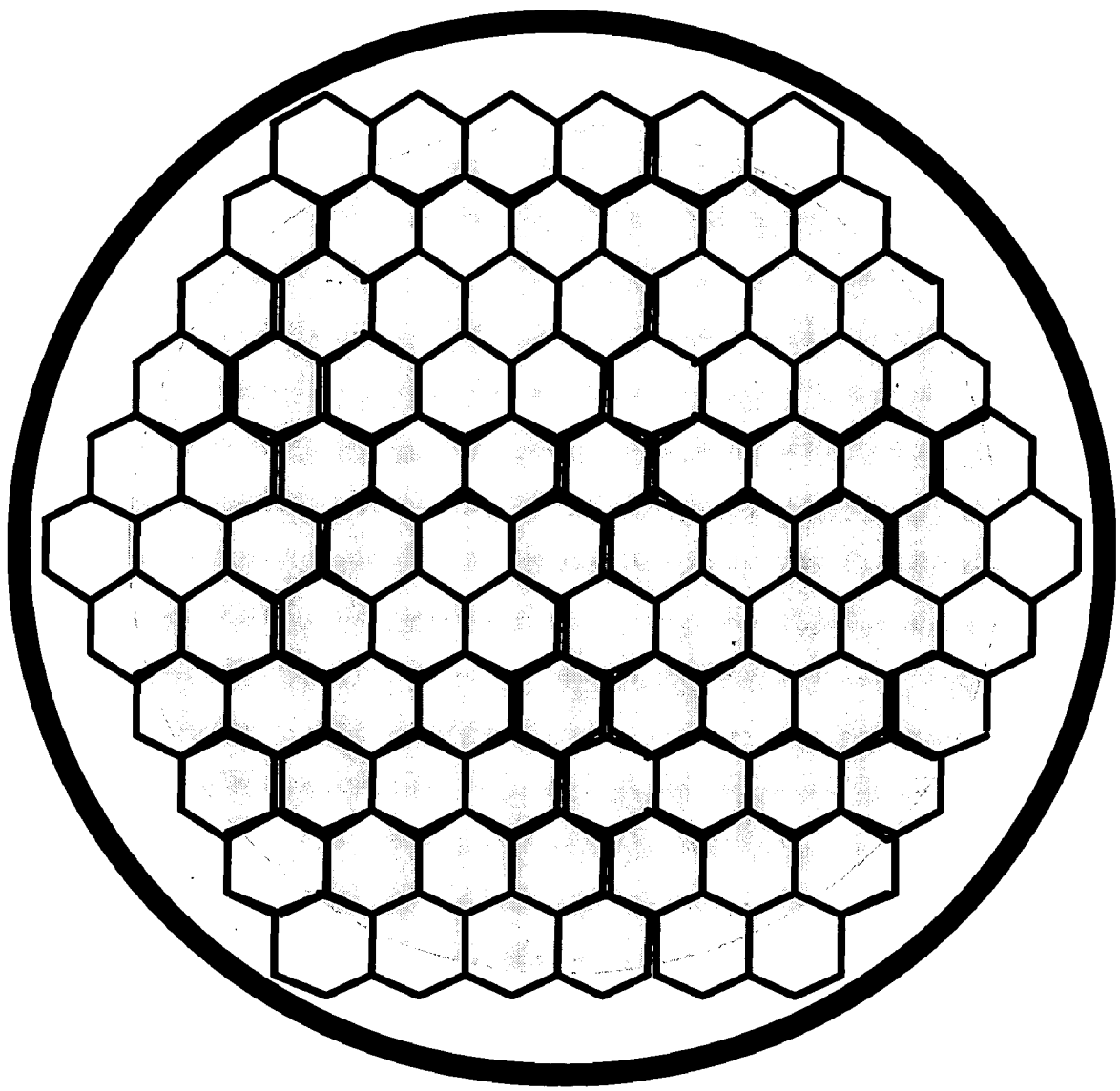
FIG. 6 is a schematic plane view showing a hexagonal micro lens array.

6, without forming Bernard cells that roughened the surface shape. Here, FIG. 6 is a schematic plane view showing the hexagonal micro lens array.

While the instant embodiment manufactures a micro lens array, a micro mirror array can be manufactured by forming a mirror using a multilayer film of Si and Mo on the substrate 10, onto which the above shape has been transferred. Such a micro mirror array can be used as a reflective integrator in an exposure apparatus that uses EUV light as exposure light.

Fourth Embodiment

This embodiment forms a cylindrical lens on a substrate similar to that in the first embodiment. A resist as photosensitive resin of SU-85 (Macdermit Co. Ltd., viscosity 290 cSt epoxy resin, solvent: Butyrolactones) was formed with a film thickness of 8 μm on the substrate 10 with a coater. The resist was additionally formed with a film thickness of 8 μm under the same conditions, and the resist was formed with a total film thickness of 16 μm.

Exposure followed with a mask having a transmittance distribution designed to form a cylindrical lens. No Bernard cells occurred in the photosensitive resin after development with a dedicated developer, and the photosensitive resin was formed with a cylindrical lens shape.

Figure 7:
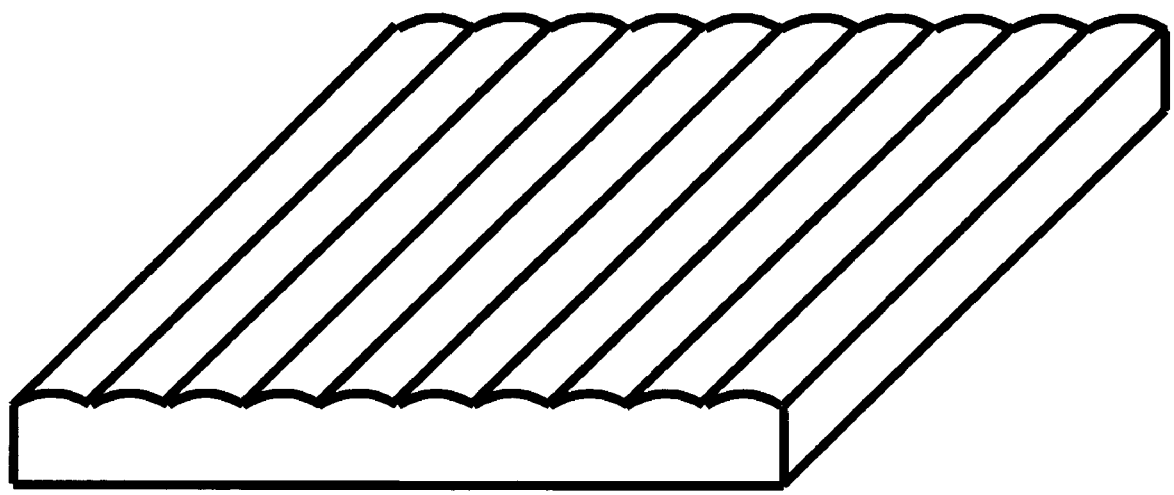
FIG. 7 is a schematic perspective view showing a cylindrical lens.

The instant embodiment used a dry etching apparatus to conduct anisotropic etching with a selectivity of 1 and transfer a cylindrical lens shape of the photosensitive resin onto the substrate. The desired cylindrical lens could be thus manufactured, as shown in FIG. 7, without forming Bernard cells that roughen the surface shape. Here, FIG. 7 is a schematic perspective view of the cylindrical lens.

While the instant embodiment manufactures a cylindrical lens, a cylindrical mirror can be manufactured by forming a mirror using a multilayer film of Si and Mo on the substrate, onto which the above shape has been transferred. Such a cylindrical mirror can be used as a reflective integrator in an exposure apparatus that uses EUV light as exposure light.

Fifth Embodiment

Figure 8A:
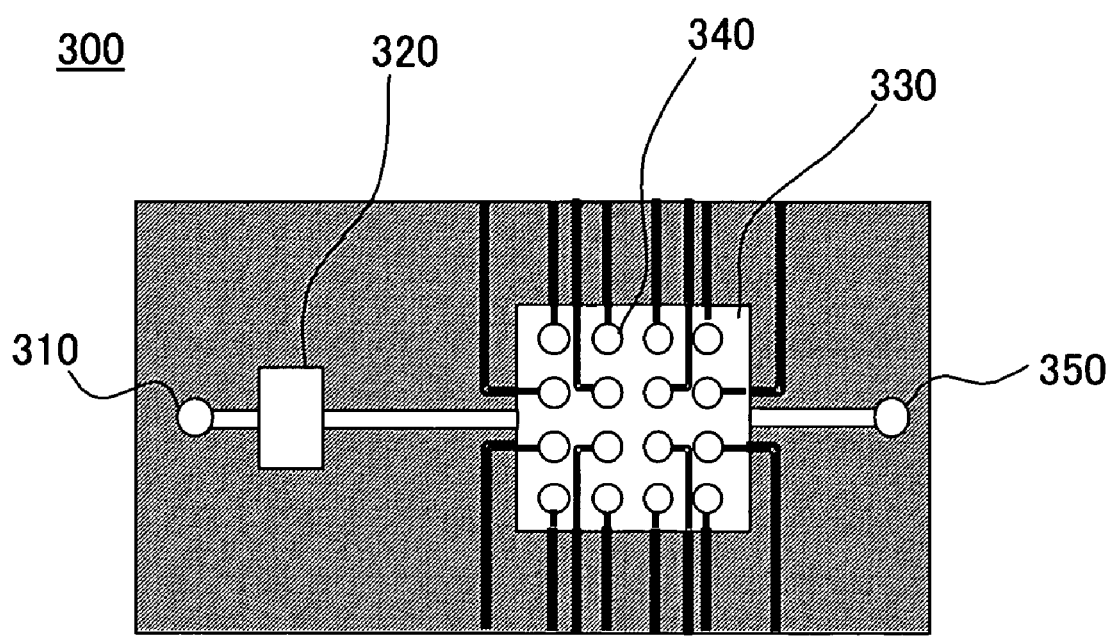
FIG. 8 is a schematic structure of one example that incorporates a multichannel biosensor with a multifunctional small system, such as a Lab-on-Chip.
Figure 8B:
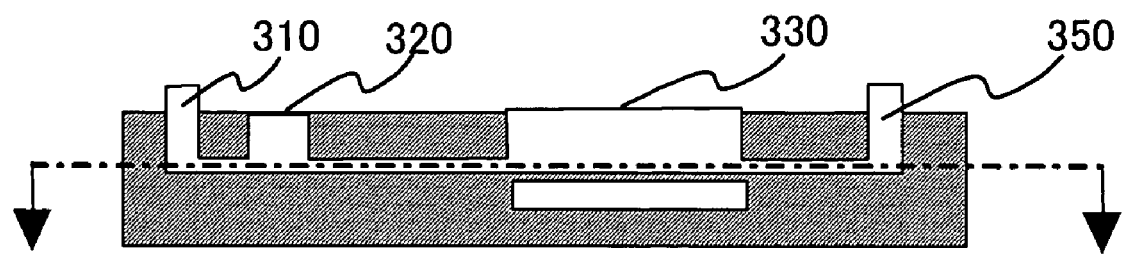

FIG. 8 is a schematic structure of one example that incorporates a multichannel biosensor into a multifunctional small system 300, such as a Lab-on-a-Chip, wherein FIG. 8A is a schematic plane view and FIG. 8B is a schematic sectional view.

Referring to FIG. 8, a solution or gas as an analysis object is introduced into a sensor system through a sample inlet 310, subject to sample separation and extraction in a pretreatment element 320, and guided to a detector part 330.

While the pretreatment may need various functions, such as a mixer/reactor, a filter, and a valve, a detailed description thereof will be omitted. In addition, the pretreatment may need specific reagent for reaction, and a channel and inlet to introduce this reagent. On the other hand, mechanical equipment, such as a pump, electrical equipment, such as electroosmosis, etc., can be broadly used to move a sample.

The detector part 330 detects the sample, and wiring of detecting channel 340 takes out data. Sample solution or gas after detections is exhausted from an outlet 350.

The inventive three-dimensional structure forming method forms the above Lab-on-a-Chip with a three-dimensional structure on a substrate similar to that in the first embodiment.

A resist as photosensitive resin of OEBR-1000 (Tokyo Ohka Kogyo Co., Ltd., viscosity 300 cSt poly(methyl methacrylate: PMMA), solvent: ethyl cellosolve acetate) was formed with a film thickness of 10 μm on the substrate with a coater. The resist was additionally formed twice with a film thickness of 10 μm under the same conditions, and the resist was formed with a total film thickness of 30 μm.

EB Exposure followed to form a three-dimensional structure shown in FIG. 8. In other words, the dose was changed and the complicated three-dimensional structure was formed as shown in FIG. 8. Exposure that uses far ultraviolet light and a mask can replace mass production. Use of the inventive three-dimensional structure forming method 100 to manufacture the above Lab-on-a-Chip could lead to a highly-sensitive, high-performance biosensor without Bernard cells that roughen the surface shape.

Figure 11:
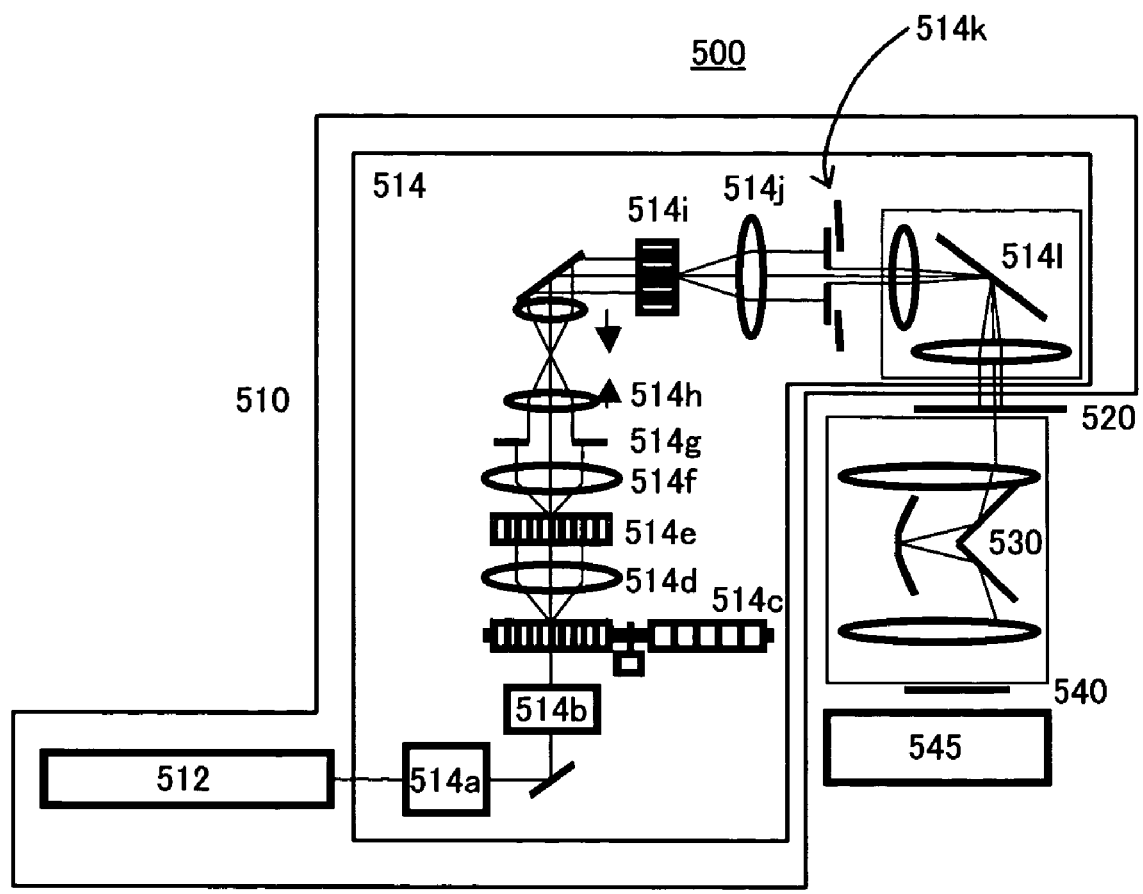
FIG. 11 is a schematic structure of an exemplary exposure apparatus of one aspect according to the present invention.

Referring now to FIG. 11, an exposure apparatus 500 according to one aspect of the present invention will be described. Here, FIG. 11 is a schematic structure of the exposure apparatus 500 according to one aspect of the present invention. The exposure apparatus 500 includes, as shown in FIG. 11, an illumination apparatus 510, a mask (or reticle) 520, a projection optical system 530, a substrate (or plate) 540, and a stage 545.

The exposure apparatus 500 is a projection exposure apparatus that uses, e.g., a step-and-repeat, or step-and-scan, manner to expose a pattern formed on the mask 520 onto the substrate 540. Such an exposure apparatus is suitably applicable to a lithography process below a submicron or quarter-micron level, and this embodiment will be described below through an example using a step-and-scan exposure apparatus (which is also called "a scanner"). The step-and-scan manner, as used herein, is an exposure method that exposes a mask pattern onto a wafer by continuously scanning the wafer relative to the mask, and by moving, after a shot of exposure, the wafer step-wise to the next exposure area to be shot. The step-and-repeat manner is another mode of an exposure method in which a wafer is moved step-wise to an exposure area for the next shot of every shot of cell projection onto the wafer.

The illumination apparatus 510, which illuminates the mask 520 that forms a circuit pattern to be transferred, includes a light source section 512 and an illumination optical system 514.

The light source section 512 uses the $F_2$ laser with a wavelength of about 157 nm as a light source in the instant embodiment. The present invention does not limit the type of the light source section 512 to the $F_2$ laser. Excimer lasers and extreme ultraviolet with a wavelength about 5 to 20 nm, for example, can also be used.

The illumination optical system 514 is an optical system that illuminates the mask 520, and includes a darkening means 514a, beam swing means 514b, a fly-eye lens 514c, a condenser lens 514d, a fly-eye lens 514e, a condenser lens 514f, an effective light source forming stop 514g, a zoom relay lens 514h, a fly-eye lens 514i, a condenser lens 514j, a masking blade 514k, a masking imaging lens 514l.

The darkening means 514a controls the light intensity on the illuminated surface. When a pulse light source, such as the $F_2$ laser, is used as the light source section 512, an exposure amount scatters due to scattering outputs among laser pulses. Therefore, it is necessary to reduce the scattering exposure amount by considering the number of exposure pulses to be the number of predetermined pulses or greater and by averaging scattering pulses. When the photosensitive agent has high sensitivity, the darkening means 514a darkens light to reduce the light intensity and expose with the number of predetermined pulses or greater.

The beam swing means 514b swings a beam from the light source section 512 and swings the speckle distribution to average speckles over time during exposure. The beam swing method includes a method for rotating an inclined parallel plate, a method for swinging a mirror, a method for rotating a wedge prism, etc. The instant embodiment uses a coherent $F_2$ laser as the light source in the light source section 512 Thus, speckles occur on the illuminated surface. Speckles occur due to non-uniform light intensity and scattering exposure amounts on the illuminated surface, and cause critical dimensions of resolved images from the mask 520 to the substrate 540 to disadvantageously differ according to locations (or deteriorate CD uniformity). Therefore, the beam swing means 514b is provided.

The fly-eye lens 514c forms a secondary light source on an exit surface, and Koehler-illuminates an incident surface of the fly-eye lens 514e through the condenser lens 514d. A turret arranges plural fly-eye lenses 514c, and can switch the exit NA from the fly-eye lens 514c, thereby changing an irradiation range on an incident surface of the fly-eye lens 514i. This is to avoid light condensing on the exit surface of the fly-eye lens 514i when the zoom relay lens 514h changes magnification.

The fly-eye lens 514e forms a tertiary light source on an exit surface, and Koehler-illuminates the effective light source forming stop 514g through the condenser lens 514d. A double fly-eye lens structure from the fly-eye lens 514c to condenser lens 514f maintains a light distribution on the effective light source forming stop 514g even when the laser beam changes its profile, and can always form a uniform, effective light source.

For example, without a fly-eye lens 514c and the condenser lens 514d, a change of a positional distribution from the laser changes the light intensity distribution on the incident surface of the fly-eye lens 514e and thus the light's angular distribution on the effective light source forming stop 514g. A change of the light's angular distribution shifts the light intensity distribution on the exit surface of the fly-eye lens 514i, which will be described below, and inclines the angular distribution on the substrate 540. When the substrate 540 defocuses, a transfer position changes (on-axis telecentricity). Therefore, a double fly-eye lens structure is used from the fly-eye lens 514c to condenser lens 514f.

The effective light source forming stop 514 defines the effective light source that is a light source for illuminating the mask 520. The effective light source usually has a circular shape. On the other hand, the fly-eye lens 514e uses a rectangular fly-eye lens in which its rod lens has a rectangular outline, a hexagonal fly-eye lens in which its rod lens has a hexagonal outline, and a cylindrical lens array that arranges cylindrical lens arrays as element lenses. Therefore, the distribution formed on the effective light source forming stop 514g at the light source section 512 would have a square shape for the rectangular fly-eye lens and the cylindrical lens array, and a hexagonal shape for the hexagonal lens array. Therefore, the effective light source forming stop 514g having a circular opening is needed to form a circular, effective light source.

The zoom relay lens 514h projects a circular light intensity distribution formed on the effective light source forming stop 514g onto the incident surface of the fly-eye lens 514i at a predetermined magnification. The size of the light source that illuminates the mask 520 is referred to as a coherent factor, and is required to be variable according to a pattern to be transferred so as to improve performance of the projection optical system 530. Accordingly, a size of the illuminated area on the incident surface of the fly-eye lens 514i is made variable by making variable the magnification of the relay optical system of the zoom relay lens 514h.

The fly-eye lens 514i forms a quaternary light source on an exit surface and illuminates the masking blade 514k with a uniform light intensity distribution through the condenser lens 514j. The fly-eye lens 514i uses an arc fly-eye lens, because the projection optical system 530 has a circular imaging area and the mask 520 should be illuminated with an arc shape. The exposure apparatus 500 is a scanner and can correct non-uniform exposure amount in the perpendicular direction by changing the width of the arc illumination area. For example, it is desirable to switch plural fly-eye lenses 514i having different arc widths arranged on a turret for an adjustment to the arc width.

The masking blade 514k controls an exposure area, and is driven according to a scan area to obtain a desired exposure area.

The masking imaging lens 5141 projects a light intensity distribution on the masking blade 514k onto the mask 520.

The illumination optical system 514 uses the fly-eye lenses 514c, 514e and 514i formed by the inventive three-dimensional structure forming method, and maintains the desired optical performance.

The mask 520 forms a circuit pattern (or an image) to be transferred and is supported and driven by a mask stage (not shown). The mask 520 is made of a material having high transmittance to a wavelength of 157 nm, such as F-doped quartz and calcium fluoride. Diffracted light from the mask 520 passes through the projection optical system 530 and is projected onto the substrate 540. The mask 520 and the substrate 540 are disposed in an optically conjugate relationship. Since the exposure apparatus 500 of the instant a scanner, a scan of the mask 520 and the substrate 540 at a reduction speed ratio transfers the pattern on the mask 520 onto the object 540.

The projection optical system 530 is a catadioptric optical system that has plural lenses and at least one concave mirror. The projection optical system 530 uses lenses and a mirror for achromatism and maintains good imaging performance in the arc imaging area.

The substrate 540 is an object to be exposed, such as a wafer and a liquid crystal substrate, and photoresist is applied onto the substrate 540.

The stage 545 supports the substrate 540. The stage 545 can be any structure known in the art, and a detailed description of its structure and operation will be omitted. The stage 545 uses, for example, a linear motor to move the substrate 540 in X-Y-Z directions. The positions of the stage (not shown) and stage 545 are monitored, for example, by a laser interferometer and the like, so that both are driven at a constant speed ratio.

In exposure, the $F_2$ laser beam emitted from the light source section 512 Koehler-illuminates the mask 520 through the illumination optical system 514. Light that transmits the mask 520 and reflects a mask pattern images on the substrate 540 through the projection optical system 530. The fly-eye lenses 514c, 514e and 514i in the illumination optical system in the exposure apparatus 500 are formed by the inventive three-dimensional structure forming method 100, and can maintain the optical performance. In addition, the fly-eye lens 514i can use an arc fly-eye lens, and the substrate 540 can maintain high light intensity on its surface. As a result, devices, such as semiconductor devices, LCD devices, image-pickup elements (e.g., CCD), and thin-film magnetic heads, higher in quality than those conventionally produced, can be provided with high throughput and good economic efficiency.

While this embodiment uses the $F_2$ laser as exposure light for the exposure apparatus, an optical element manufactured according to the inventive three-dimensional structure forming method 100 can use X-rays such as EUV, for exposure light.

Figure 12:
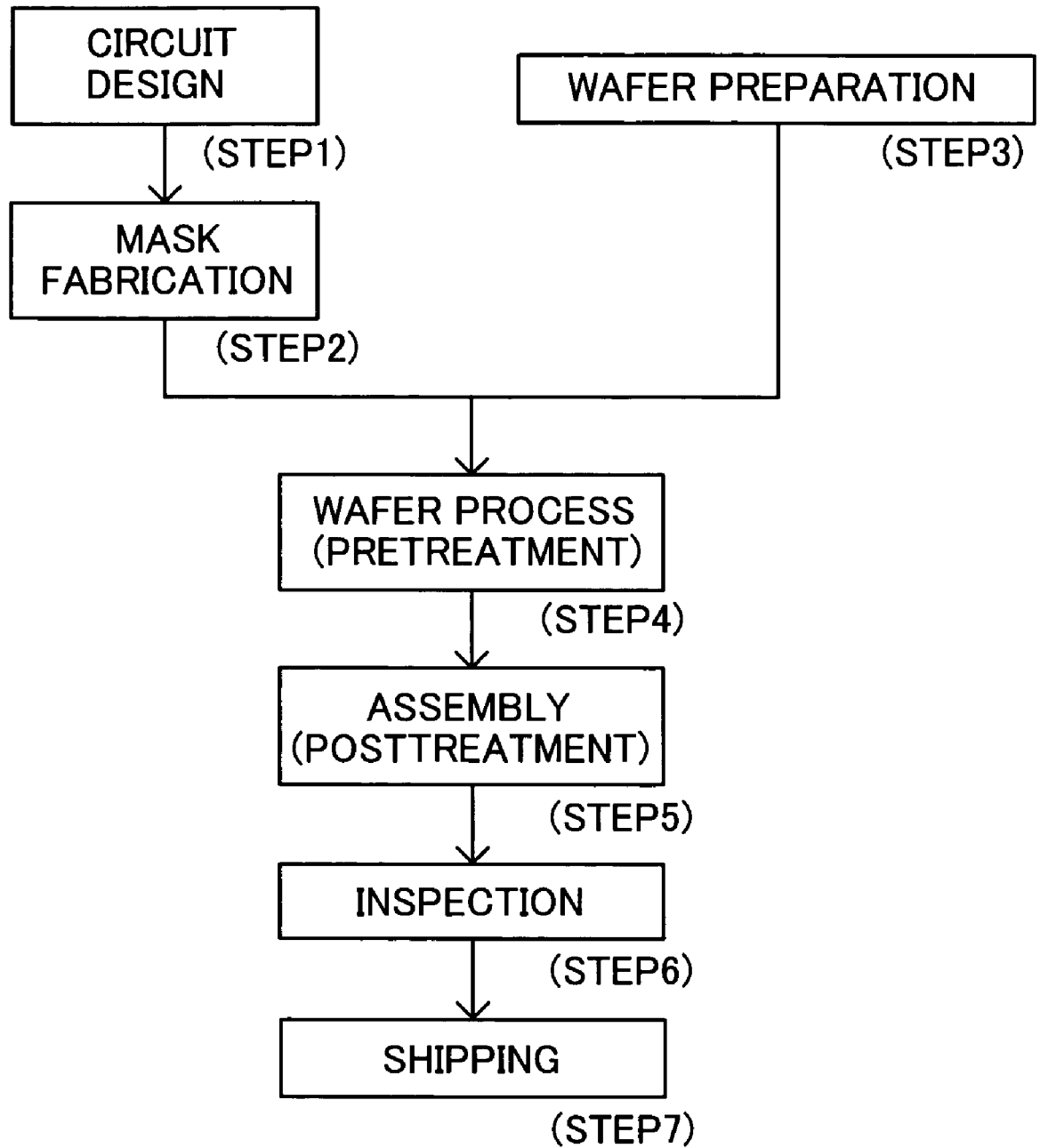
FIG. 12 is a flowchart for explaining how to fabricate devices (such as semiconductor chips, e.g., ICs and LSIs, LCDs, CCDs, and the like).
Figure 13:
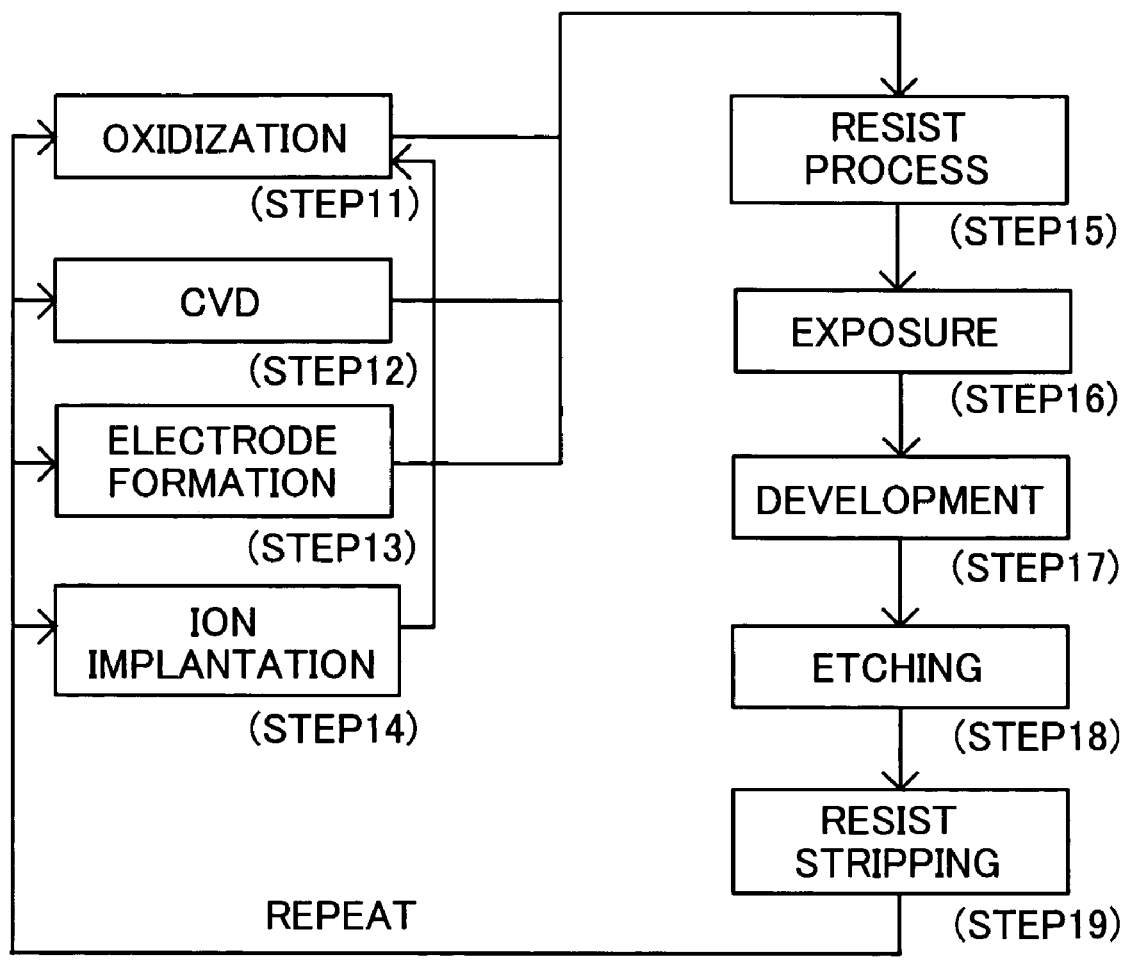
FIG. 13 is a flowchart for step 4 that is a wafer process shown in FIG. 12.
Figure 14:
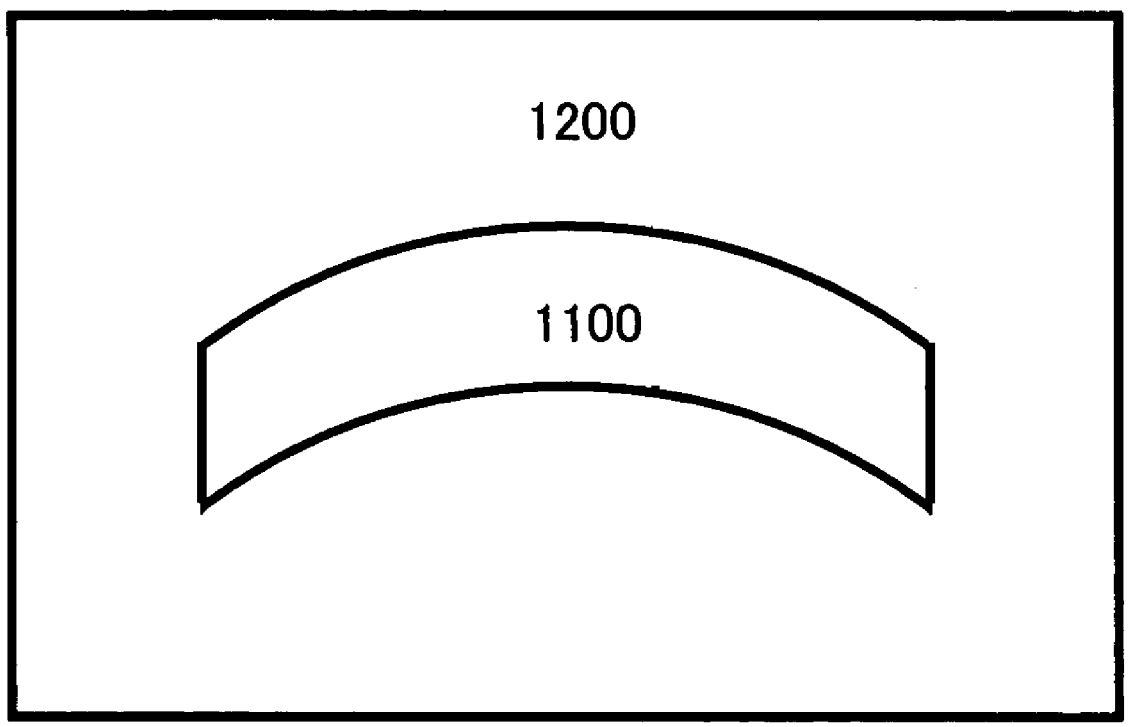
FIG. 14 is a schematic plane view showing an exemplary slit for taking an arc illumination area out of a rectangular illumination area.
Figure 15:
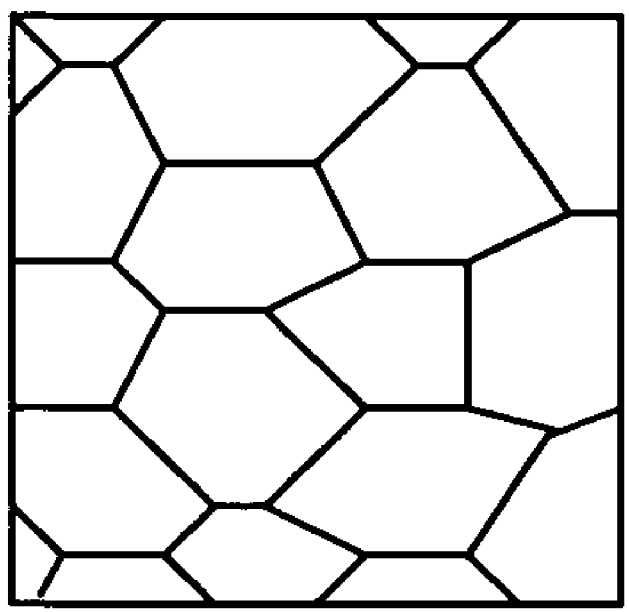
FIG. 15 is a schematic plane view showing an exemplary Bernard cell generated in a photosensitive resin.

Referring to FIGS. 12 and 13, a description will now be provided of an embodiment of a device fabrication method using the above-mentioned exposure apparatus 500. FIG. 12 is a flowchart for explaining a fabrication of devices (i.e., semiconductor chips such as IC and LSI, LCDs, CCDs, etc.). Here, a description will be provided of a fabrication of a semiconductor chip as an example. In Step 1 (circuit design), a semiconductor device circuit is designed. In Step 2 (mask fabrication), a mask having a designed circuit pattern is formed. In Step 3 (wafer making), a wafer using materials, such as silicon, is manufactured. In Step 4 (wafer process), which is referred to as pretreatment, actual circuitry is formed on the wafer through photolithography using the mask and the wafer. In Step 5 (assembly), which is also referred to as post-treatment, the wafer formed in Step 4 is formed into a semiconductor chip and includes an assembly step (e.g., dicing, bonding), a packaging step (chip sealing), and the like. In Step 6 (inspection), various tests for the semiconductor device made in Step 5, such as a validity test and a durability test, are performed. Through these steps, a semiconductor device is finished and shipped (Step 7).

FIG. 13 is a detailed flowchart of the wafer process in Step 4. In Step 11 (oxidation), the wafer's surface is oxidized. In Step 12 (CVD), an insulating film is formed on the wafer's surface. In Step 13 (electrode formation), electrodes are formed on the wafer by vapor disposition and the like. In Step 14 (ion implantation), ions are implanted into the wafer. In Step 15 (resist process), a photosensitive material is applied onto the wafer. In Step 16 (exposure), the exposure apparatus 500 is used to expose a circuit pattern on the mask onto the wafer. In Step 17, (development) the exposed wafer is developed. In Step 18 (etching), parts other than a developed resist image are etched. In Step 19 (resist stripping), disused resist after etching is removed. These steps are repeated, and multilayer circuit patterns are formed on the wafer. This device fabrication method may be used to manufacture devices higher in quality than conventional devices. In this manner, the device fabrication method that uses the exposure apparatus 500 and resultant devices are other aspects of the present invention.

Further, the present invention is not limited to these preferred embodiments, and numerous variations and modifications may be made without departing from the scope of the present invention.

Thus, the present invention can provide a three-dimensional structure forming method that can be used to form a three-dimensional structure on a thick photosensitive resin without roughening the shape of the surface.

What is claimed is:

1. A three-dimensional structure forming method that forms a three-dimensional structure made of a photosensitive material on a substrate, said method comprising the steps of:

forming a first layer by applying onto the substrate the photosensitive material with a first film thickness within a preset maximum film thickness; and forming a second layer by applying onto the first layer the photosensitive material with a second film thickness within the maximum film thickness before exposing the first layer.

2. A three-dimensional structure forming method according to claim 1, further comprising the steps of:

exposing, with light having an energy distribution corresponding to the desired three-dimensional structure, the first and second layers; and developing the exposed first and second layers.

3. A three-dimensional structure forming method according to claim 2, further comprising the step of etching the substrate using the exposed first and second layers.

4. A three-dimensional structure forming method according to claim 1, wherein the substrate is an optical element.

5. A three-dimensional structure forming method according to claim 1, wherein the substrate is a mold.

6. A three-dimensional structure forming method according to claim 1, wherein the photosensitive material is made of novolac resin.

7. A three-dimensional structure forming method according to claim 1, wherein in the forming steps the photosensitive material is applied through a solvent, and the solvent is propylene glycol monomethyl ether acetate.

8. A three-dimensional structure forming method according to claim 1, wherein the maximum film thickness is equal to or smaller than 12 μm.

9. A three-dimensional structure forming method according to claim 1, wherein the step of forming the first layer comprises a step of baking the first layer, and the step of forming the second layer comprises a step of baking the second layer.

10. An optical element manufactured by a three-dimensional structure forming method that forms a three-dimensional structure made of a photosensitive material on a substrate, said method comprising the steps of forming a first layer by applying onto the substrate the photosensitive material with a first film thickness within a preset maximum film thickness, and forming a second layer by applying onto the first layer the photosensitive material with a second film thickness within the maximum film thickness before exposing the first layer.

11. An optical element according to claim 10, wherein the optical element is a lens array that forms plural lenses on an array.

12. An optical element according to claim 11, wherein the plural lenses have a shape of a hexagon, an arc, or a rectangle.

13. An optical element according to claim 12, wherein the shape has a width between 12 μm and 2 mm.

14. A biochip manufactured by a three-dimensional structure forming method that forms a three-dimensional structure made of a photosensitive material on a substrate, said method comprising the steps of forming a first layer by applying onto the substrate the photosensitive material with a first film thickness within a preset maximum film thickness; and forming a second layer by applying onto the first layer the photosensitive material with a second film thickness within the maximum film thickness before exposing the first layer.

15. An exposure apparatus comprising an optical system, which includes the optical element manufactured by a three-dimensional structure forming method that forms a three-dimensional structure made of a photosensitive material on a substrate, said method comprising the steps of forming a first layer by applying onto the substrate the photosensitive material with a first film thickness within a preset maximum film thickness, and forming a second layer by applying onto the first layer the photosensitive material with a second film thickness within the maximum film thickness before exposing the first layer.

16. A device fabrication method comprising the steps of:
   exposing an object using an exposure apparatus; and developing the object that has been exposed,
wherein said exposure apparatus includes an optical system and exposes an object through the optical system, and
wherein said optical system includes the optical element manufactured by a three-dimensional structure forming method that forms a three-dimensional structure made of a photosensitive material on a substrate, said method comprising the steps of forming a first layer by applying onto the substrate the photosensitive material with a first film thickness within a preset maximum film thickness, and forming a second layer by applying onto the first layer the photosensitive material with a second film thickness within the maximum film thickness before exposing the first layer.

* * * * *

UNITED STATES PATENT AND TRADEMARK OFFICE
CERTIFICATE OF CORRECTION

| | |
|---|---|
| PATENT NO. | : 7,027,227 B2 |
| APPLICATION NO. | : 10/761293 |
| DATED | : April 11, 2006 |
| INVENTOR(S) | : Keiko Chiba et al. |

It is certified that error appears in the above-identified patent and that said Letters Patent is hereby corrected as shown below:

SHEET 1:

Figure 1, "DETERMINDED" should read --DETERMINED--.

COLUMN 2:

Line 36, "element lens" should read --element lenses--; and
    Line 64, "resin," should read --resin's--.

Figure 3C:
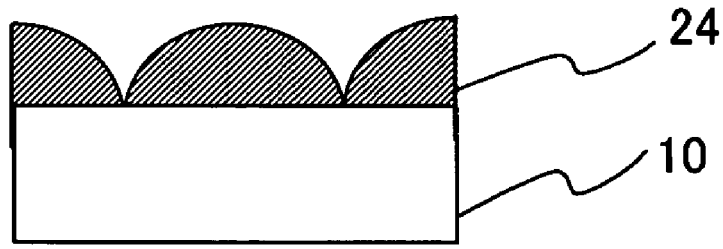

COLUMN 4:

Line 29, "above claims" should read --above. Claims--;
    Line 45, "FIG. 2 is a schematic sectional view" should read --FIGS. 2A, 2B, 2C and 2D are schematic sectional views--;
    Line 47, "FIG. 3 is a schematic sectional view" should read --FIGS. 3A, 3B and 3C are schematic sectional views--;
    Line 49, "FIG. 4 is a schematic sectional view" should read --FIGS. 4A, 4B, 4C, 4D, 4E and 4F are schematic sectional views--;
    Line 51, "FIG. 5 is a schematic sectional view" should read --FIGS. 5A, 5B and 5C are schematic sectional views--; and
    Line 56, "FIG. 8 is a schematic sectional view" should read --FIGS. 8A and 8B are schematic sectional views--.

COLUMN 5:

Line 40, "a is the NA" should read --$\alpha$ is the NA--;
    Line 49, "below" should read --below defines--; and
    Line 66, "small a" should read --small $\sigma$--.

COLUMN 7:

Line 20, "FIG. 2 is a schematic sectional view" should read --FIGS. 2A, 2B, 2C and 2D are schematic sectional views; and
    Line 55, "FIG 3 is a schematic sectional view" should read --FIGS. 3A, 3B and 3C are schematic sectional views--.

UNITED STATES PATENT AND TRADEMARK OFFICE
CERTIFICATE OF CORRECTION

PATENT NO. : 7,027,227 B2
APPLICATION NO. : 10/761293
DATED : April 11, 2006
INVENTOR(S) : Keiko Chiba et al.

It is certified that error appears in the above-identified patent and that said Letters Patent is hereby corrected as shown below:

COLUMN 8:

Line 3, "FIG. 4 is a schematic sectional view" should read --FIGS. 4A, 4B, 4C, 4D, 4E and 4F are schematic sectional views--;
    Line 29, "substrate 30;" should read --substrate 30--;
    Line 43, "FIG. 5 is a schematic sectional view" should read --FIGS. 5A, 5B, and 5C are schematic sectional views--; and
    Line 48, "(Clariant Co." should read --(Clariant Co.,--.

COLUMN 9:

Line 42, "FIG. 8 is a schematic sectional view" should read --FIGS. 8A and 8B are schematic sectional views--;
    Line 46, "FIG. 8," should read --FIGS. 8A and 8B,--; and
    Line 53, "specific" should read --a specific--.

COLUMN 10:

Line 6, "FIG. 8." should read --FIGS. 8A and 8B.--;
    Line 8, "FIG. 8." should read --FIGS. 8A and 8B.-.-;
    Line 9, "mass production." should read --mass-production.--; and
    Line 64, "expose" should read --exposure--.

COLUMN 11:

Line 6, "512 Thus," should read --512. Thus,--.

COLUMN 12:

Line 18, "5141" should read --514$l$--;
    Line 32, "of the instant" should read --is--; and
    Line 55, "a mask" should read --mask--.

UNITED STATES PATENT AND TRADEMARK OFFICE
CERTIFICATE OF CORRECTION

PATENT NO. : 7,027,227 B2
APPLICATION NO. : 10/761293
DATED : April 11, 2006
INVENTOR(S) : Keiko Chiba et al.

It is certified that error appears in the above-identified patent and that said Letters Patent is hereby corrected as shown below:

COLUMN 13:

Line 36, "17, (development)" should read --17 (development),--.

Signed and Sealed this

Twenty-fourth Day of October, 2006

JON W. DUDAS
*Director of the United States Patent and Trademark Office*